(12) United States Patent
Yim et al.

(10) Patent No.: US 8,569,114 B2
(45) Date of Patent: Oct. 29, 2013

(54) METHOD OF FORMING A SEMICONDUCTOR DEVICE PACKAGE

(75) Inventors: Choongbin Yim, Cheonan-si (KR);
Seungkon Mok, Suwon-si (KR);
Donghan Kim, Osan-si (KR); Jin-Woo Park, Seoul (KR); PaLan Lee, Yongin-si (KR); Mi-yeon Kim, Asan-si (KR)

(73) Assignee: Samsung Electronics Co. Ltd., Suwon-Si (KR)

( * ) Notice: Subject to any disclaimer, the term of this patent is extended or adjusted under 35 U.S.C. 154(b) by 264 days.

(21) Appl. No.: 12/788,956

(22) Filed: May 27, 2010

(65) Prior Publication Data

US 2010/0304530 A1 Dec. 2, 2010

(30) Foreign Application Priority Data

Jun. 1, 2009 (KR) .................. 10-2009-0048214

(51) Int. Cl.
*H01L 21/00* (2006.01)
(52) U.S. Cl.
USPC ....................................... 438/127

(58) Field of Classification Search
USPC ................... 438/108, 126, 127, 107
See application file for complete search history.

(56) References Cited

U.S. PATENT DOCUMENTS

| 7,429,501 | B1 | 9/2008 | Wu et al. | |
| 8,097,489 | B2 * | 1/2012 | Pagaila et al. | 438/106 |
| 2008/0293189 | A1 * | 11/2008 | Kobayashi | 438/121 |
| 2009/0027860 | A1 * | 1/2009 | Webb | 361/722 |

FOREIGN PATENT DOCUMENTS

| JP | 2005-026469 | 1/2005 |
| JP | 2008-171904 | 7/2008 |
| JP | 2008-263121 | 10/2008 |

\* cited by examiner

*Primary Examiner* — Jenny L Wagner
(74) *Attorney, Agent, or Firm* — F. Chau & Associates, LLC

(57) ABSTRACT

Provided is a method of forming a semiconductor package. In the method, a first package including a first chip on a first substrate is formed, a second package including a second chip on a second substrate is formed, a molding cap provided with a via hole and a recess structure configured to receive the first chip is formed, and the second package is provided on the first package with the molding cap being therebetween such that the recess receives the first chip. The via hole and the recess structure are simultaneously formed.

18 Claims, 17 Drawing Sheets

METHOD OF FORMING A SEMICONDUCTOR DEVICE PACKAGE

CROSS-REFERENCE TO RELATED APPLICATIONS

This U.S. non-provisional patent application claims priority under 35 U.S.C. §119 to Korean Patent Application No. 10-2009-0048214, filed on Jun. 1, 2009, the entire disclosure of which is hereby incorporated by reference herein in its entirety.

BACKGROUND

The present disclosure herein relates to a method of forming a semiconductor device package, and more particularly, to formation of a moulding cap of a semiconductor device package.

As the performances of electronic appliances are being improved, the operational speeds of semiconductor chips are likewise also being improved. In addition, as electronic appliances are miniaturized, compactness, slimness and lightweight trends in semiconductor packages may also increase. One of interconnection technologies for addressing these trends is the flip chip bonding technology. The flip chip bonding technology is a technology that may attach and mount each semiconductor chip obtained by cutting a wafer onto a printed circuit board without packaging the semiconductor chip. The term "flip chip" has been adopted as a chip is flipped over. A semiconductor chip may be mounted on a substrate by forming bumps on pads disposed in the upper portion of the semiconductor chip, and by connecting connection pads printed on the substrate to the bumps in a soldering manner. According to the flip chip bonding technology, as a chip can be mounted in its size on a substrate, the flip chip bonding technology is a representative chip scale package (CSP). The flip chip bonding technology is called a semiconductor mounting technology without using a lead frame, that is, a wireless semiconductor mounting technology. The flip chip bonding technology may improve electrical characteristics as a connection distance between a chip and a pad may be small, and may improves thermal characteristics as the back side of a chip may be exposed to the outside. Furthermore, the flip chip bonding technology can facilitate the attaching of solder balls using self-alignment characteristics of solder balls.

Recently, as semiconductor devices and electronic appliances including semiconductor devices grow in capacity, and are slimmed and miniaturized, various package technologies for addressing these trends are being increasingly introduced. According to one of these package technologies, various semiconductor chips can be vertically stacked to achieve high density chip stacking. This technology can integrate semiconductor chips having various functions in a smaller area than that of a typical package configured by a single semiconductor chip.

However, a package technology of stacking a plurality of semiconductor chips may be less in yield than a package technology using a single semiconductor chip. To prevent yield reduction and achieve high density chip stacking, the so-called package on package (POP) technology, which stacks a package on a package, has been suggested. As the POP technology uses semiconductor packages which passed a test, defects of final products can be reduced.

Nevertheless, there is still a need in the art for a more reliable structure in stacking semiconductor packages.

SUMMARY

The present disclosure may provide a more reliable structure in stacking semiconductor packages.

Embodiments of the inventive concept may provide methods of forming a semiconductor package. The methods include forming a first package including a first chip on a first substrate, forming a second package including a second chip on a second substrate, forming a moulding cap provided with a via hole and a recess structure configured to receive the first chip and providing the second package on the first package with the moulding cap being therebetween such that the recess structure receives the first chip. The via hole and the recess structure are simultaneously formed.

The moulding cap may be formed using a mould providing the via hole.

The forming of the contact in the via hole may include: providing a solder ball on at least one of the first and second pads and providing the solder ball into the via hole.

A middle portion of the contact may have a cross section that is less than those of upper and lower portions of the contact.

In accordance with another embodiment, a method of forming a semiconductor package is provided. The method includes forming a first package including a first chip on a first substrate by mounting the first chip on the first substrate, electrically connecting the first substrate to the first chip through bonding bumps or bonding wires, forming a passivation material between the first substrate and the first chip and on a sidewall of the first chip, forming a second package including a second chip on a second substrate by mounting the second chip on the second substrate, electrically connecting the second substrate to the second chip through bonding bumps or bonding wires and forming a passivation material on the second substrate to mould the second chip, forming a moulding cap provided with via holes and a recess structure configured to receive the first chip. The molding cap is formed using a mold comprising an upper mould and a lower mould and by injecting an epoxy moulding compound (EMC) into a formation region between the upper mould and the lower mould and then curing the EMC. The lower mould is provided with a first projection for forming the recess structure and the upper mold is provided with a second projection for forming the via holes. The method further includes adhering the moulding cap to an upper surface of the first package by an adhesive such that the recess structure receives the first chip therein and providing the second package on a top surface of the moulding cap adhered to the first package such that the moulding cap is disposed between the first package and the second package.

BRIEF DESCRIPTION OF THE DRAWINGS

The accompanying figures are included to provide a further understanding of the inventive concept, and are incorporated in and constitute a part of this specification. The drawings illustrate exemplary embodiments of the inventive concept and, together with the description, serve to explain principles of the inventive concept. In the figures.

DETAILED DESCRIPTION OF THE EXEMPLARY EMBODIMENTS

Figure 1:
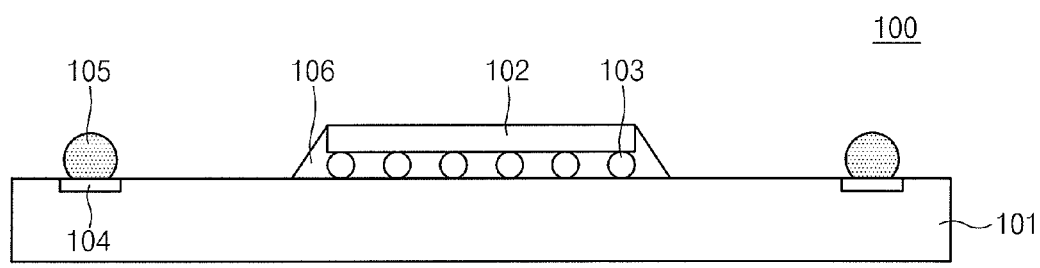
FIGS. 1 through 7 are cross-sectional views and a perspective view illustrating a method of forming a semiconductor package according to an embodiment of the inventive concept.

Exemplary embodiments of the inventive concept will be described below in more detail with reference to the accompanying drawings. The inventive concept may, however, be embodied in different forms and should not be construed as limited to the embodiments set forth herein. Rather, these embodiments are provided so that this disclosure will be thorough and complete, and will fully convey the scope of the inventive concept to those skilled in the art. Like reference numerals refer to like elements throughout.

In the specification, it will be understood that when a layer (or film) is referred to as being 'on' another layer or substrate, it can be directly on the other layer or substrate, or intervening layers may also be present. In the figures, the dimensions of layers and regions are exaggerated for clarity of illustration. Also, though terms like a first, a second, and a third are used to describe various regions and layers in various embodiments of the inventive concept, the regions and the layers are not limited to these terms. These terms are used only to discriminate one region or layer from another region or layer. Therefore, a layer referred to as a first layer in one embodiment can be referred to as a second layer in another embodiment. An embodiment described and exemplified herein includes a complementary embodiment thereof.

In the following description, the technical terms are used only for explain a specific exemplary embodiment while not limiting the inventive concept. The meaning of "include," "comprise," "including," or "comprising," specifies a property, a region, a fixed number, a step, a process, an element and/or a component but does not exclude other properties, regions, fixed numbers, steps, processes, elements and/or components.

Additionally, the embodiment in the detailed description will be described with sectional views as ideal exemplary views of the inventive concept. In the figures, the dimensions of layers and regions are exaggerated for clarity of illustration. Accordingly, shapes of the exemplary views may be modified according to manufacturing techniques and/or allowable errors. Therefore, the embodiments of the inventive concept are not limited to the specific shape illustrated in the exemplary views, but may include other shapes that may be created according to manufacturing processes. For example, although an etch region is illustrated as a right-angled region, the etch region may be actually round or have a predetermined curvature. Areas exemplified in the drawings have general properties, and are used to illustrate a specific shape of a device region. Thus, this should not be construed as limited to the scope of the inventive concept.

Hereinafter, exemplary embodiments of the inventive concept will be described in detail with reference to the accompanying drawings.

One Embodiment

FIGS. 1 through 7 are cross-sectional views and a perspective view illustrating a semiconductor package and a method of forming the semiconductor package according to an embodiment of the inventive concept.

Referring to FIG. 1, a first chip 102 may be disposed on a first substrate 101 to form a first package 100. The first substrate 101 may be electrically connected to the first chip 102 through bonding bumps or bonding wires. In the current embodiment, the first chip 102 may be electrically connected to the first substrate 101 through bonding bumps 103 in a flip chip shape. After the first chip 102 is mounted on the first substrate 101, a passivation material 106 may be formed to physically protect the first chip 102. In the current embodiment, the passivation material 106 may be disposed between the first chip 102 and the first substrate 101 and on a side wall of the first chip 102. The passivation material 106 may include, for example, an epoxy moulding compound (EMC).

The upper portion of the first substrate 101 may be provided with first pads 104 for an electrical connection. In the current embodiment, first bumps 105 are disposed on the first pads 104. The first bumps 105 may be used as members for electrically connecting to a second package to be described later.

Figure 2:
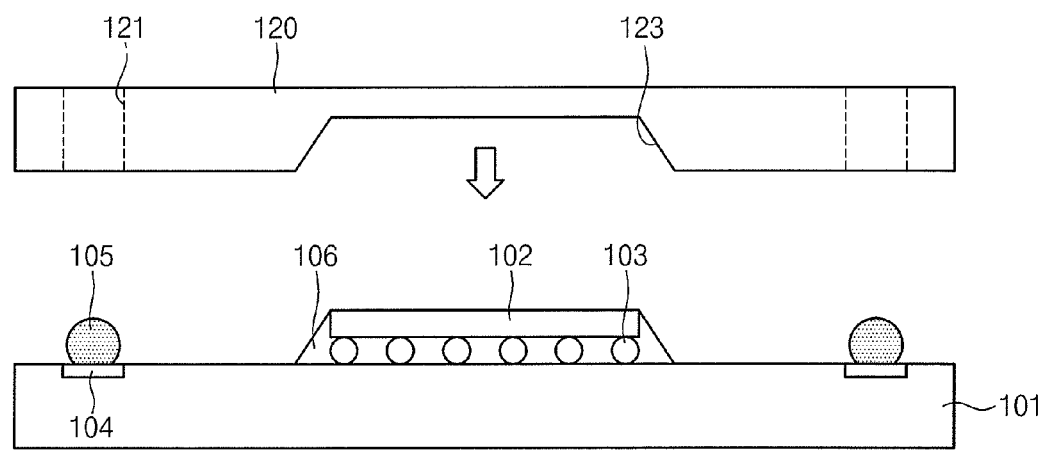
Figure 3:
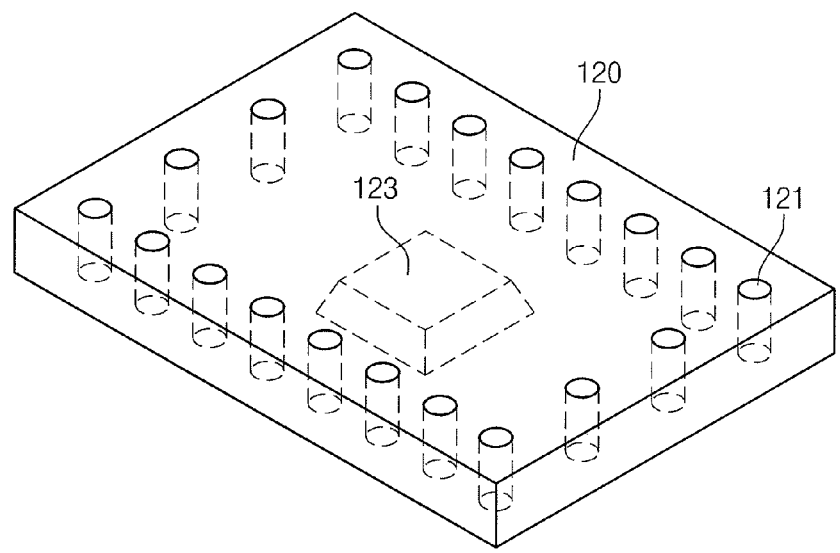

Referring to FIGS. 2 and 3, a moulding cap 120 is disposed on the first package 100. The moulding cap 120 includes via holes 121 as passages for electrically connecting the first package 100 to the second package to be described later. In the current embodiment, the via holes 121 may have a constant cross section. The via holes 121 may be disposed at positions corresponding to those of the first bumps 105. In the current embodiment, the lower portion of the moulding cap 120 may have a recess structure 123 corresponding to the first package 100. In the specification, recess structures include a structure having a recessed portion, a trench structure, and a structure having an open portion. The moulding cap 120 may be adhered to the first package 100, e.g., through an adhesive. In the current embodiment, the moulding cap 120 may be adhered to the first package 100 through, for example, an epoxy.

Figure 4:
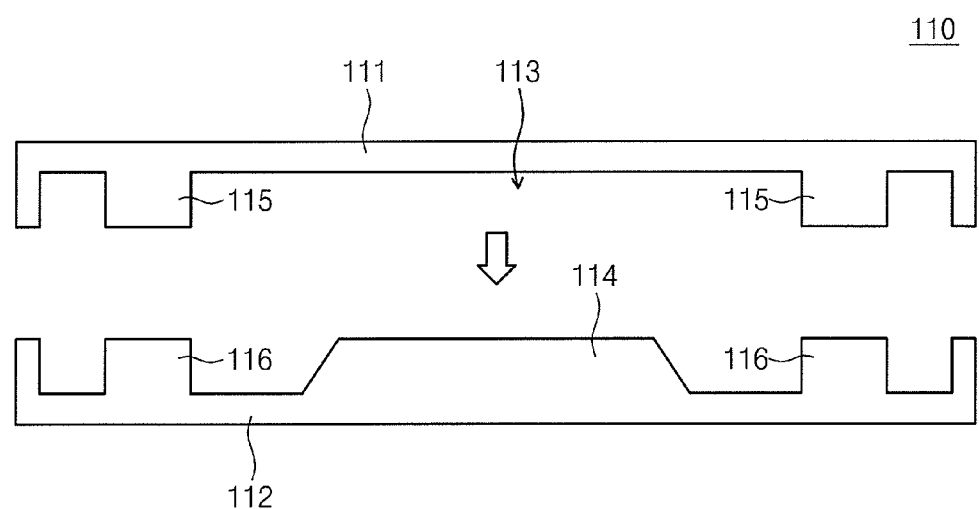

FIG. 4 is a cross-sectional view illustrating a mould 110 for forming the moulding cap 120. The moulding cap 120 and the via holes 121 may be formed using the mould 110. In the current embodiment, a recess structure 123 is provided to the moulding cap 120. For example, the moulding cap 120 may be formed of EMC. In the current embodiment, the moulding cap 120 may be formed by injecting EMC into a formation region 113 between an upper mould 111 and a lower mould 112, and then, by curing the EMC. The via holes 121 and the recess structure 123 may be simultaneously formed. The lower mould 112 is provided with a first projection part 114 for forming the recess structure 123. The first projection part 114 may have a shape corresponding to the upper surface of the first package 100. The upper mould 111 may be provided with second projection parts 115 for forming the via holes 121. The lower mould 112 may be provided with third projection parts 116 for forming the via holes 121. The via holes 121 may be defined by the second projection parts 115 and the third projection parts 116. In the current embodiment, the via holes 121 may have constant cross sections. The moulding cap 120 may be formed in plurality in a single process using a mould, and then, be separated.

Figure 5A:
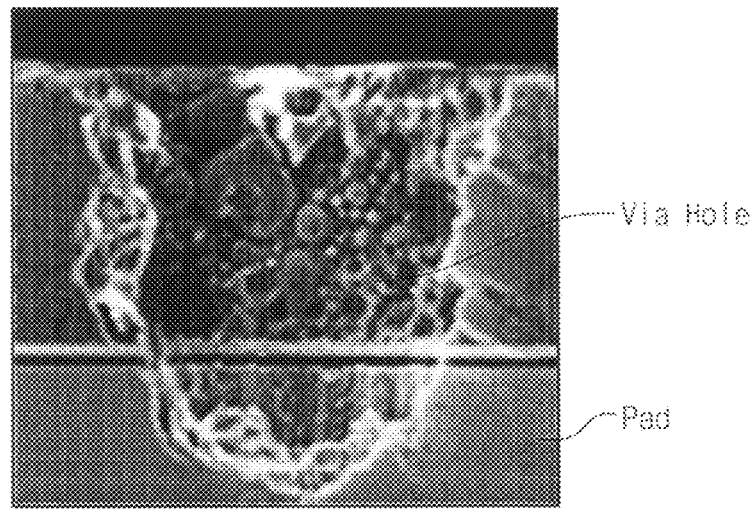
Figure 5B:
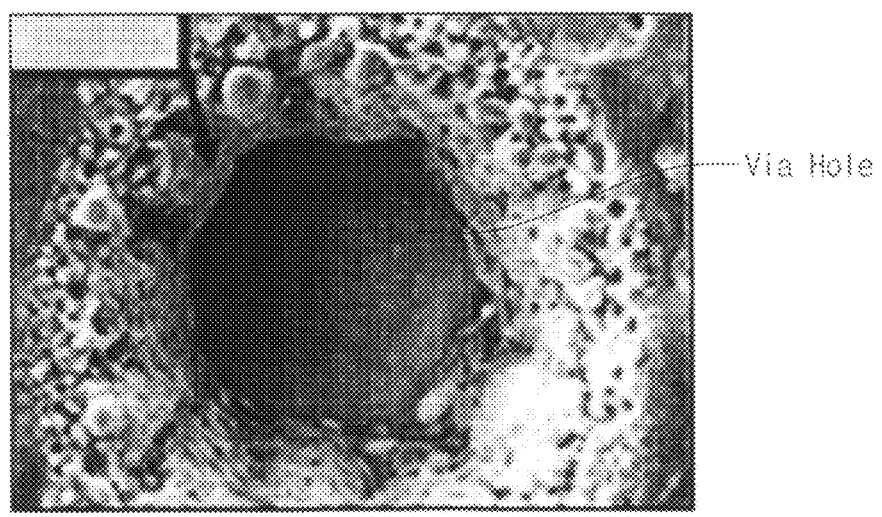

When the via holes 121 are mechanically formed using a member such as, for example, a laser, a punch, or a drill, contaminants may be formed in the inner and upper portions of the via holes 121. Such contaminants may cause a stack defect when an upper package is stacked. For example, when a laser is used to form the via holes 121, the laser may damage the first substrate 101 and the first pads 104 provided at the lower side. FIG. 5A is an image illustrating pad damage that may occur when a via hole is formed using a laser. FIG. 5B is an image illustrating contaminants around a via hole when a via hole is formed using a laser. In the current embodiment, as the via holes 121 are formed using the mould 110, the damage illustrated in FIGS. 5A and 5B can be prevented. In addition, when the via holes 121 are formed using the mould 110, the process can be more simplified than a process of independently forming the via holes 121 using a member such as, for example, a laser.

Figure 6:
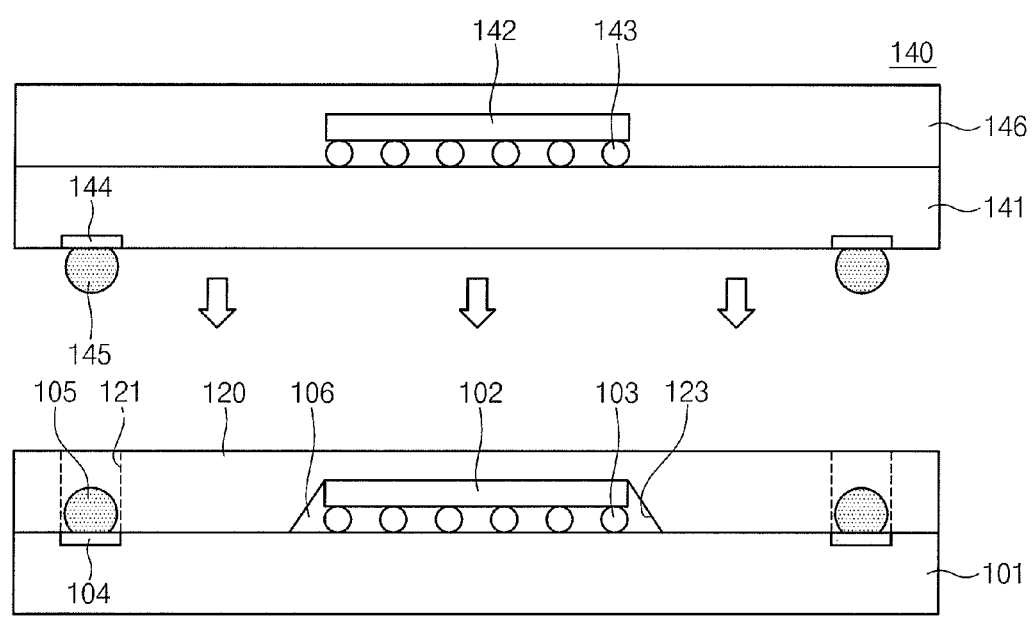

Referring to FIG. 6, a second package 140 is disposed on the first package 100 provided with the moulding cap 120. A second chip 142 may be disposed on a second substrate 141 to form the second package 140. The second substrate 141 may be electrically connected to the second chip 142 through wire bonding or bumps. In the current embodiment, the second chip 142 is electrically connected to the second substrate 141 through bonding bumps 143 in a flip chip shape. After the second chip 142 is mounted on the second substrate 141, a passivation material 146 may be formed to physically protect the second chip 142. The passivation material 146 may be disposed on the second substrate 141 to mould the second chip 142. The passivation material 146 may include, for example, an epoxy moulding compound (EMC).

The lower portion of the second substrate 141 may be provided with second pads 144 for an electrical connection. In the current embodiment, second bumps 145 are disposed on the second pads 144. The second bumps 145 may be used as members for electrically connecting to the first package 100. The second bumps 145 may be disposed at positions corresponding to the positions of the via holes 121. In the current embodiment, the second package 140 may be adhered to the moulding cap 120 through, for example, an epoxy.

Figure 7:
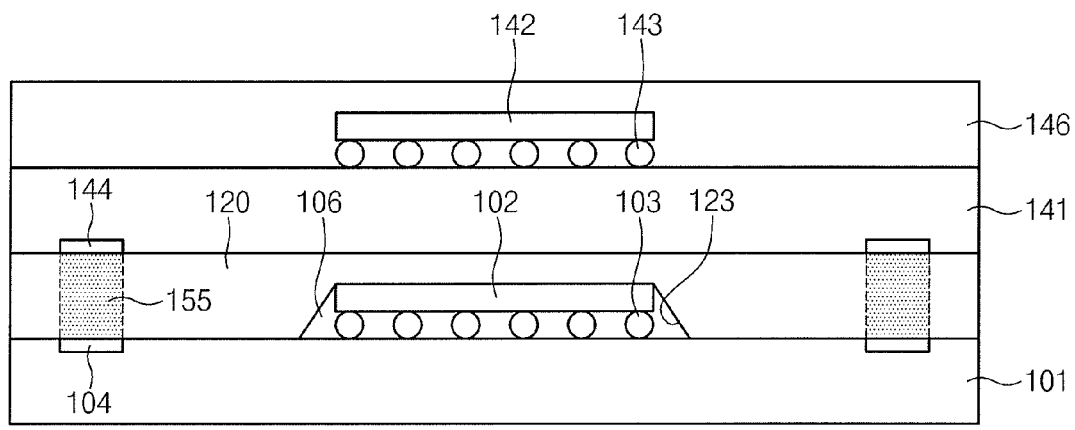

Referring to FIG. 7, the first bumps 105 and the second bumps 145 reflow through a reflow process. Contacts 155 may be formed through the reflow process to electrically connect the first package 100 to the second package 140.

Another Embodiment

A method of forming a semiconductor package will now be described according to another embodiment of the inventive concept. The current embodiment is similar to the previous one except for a contact forming method, the shape of a via hole, and the structure of a moulding cap. Thus, descriptions of the same technical characteristics to those of the previous embodiment will be omitted for convenience.

FIGS. 8 through 12 are cross-sectional views and a perspective view illustrating the method of forming a semiconductor package according to the current embodiment.

Figure 8:
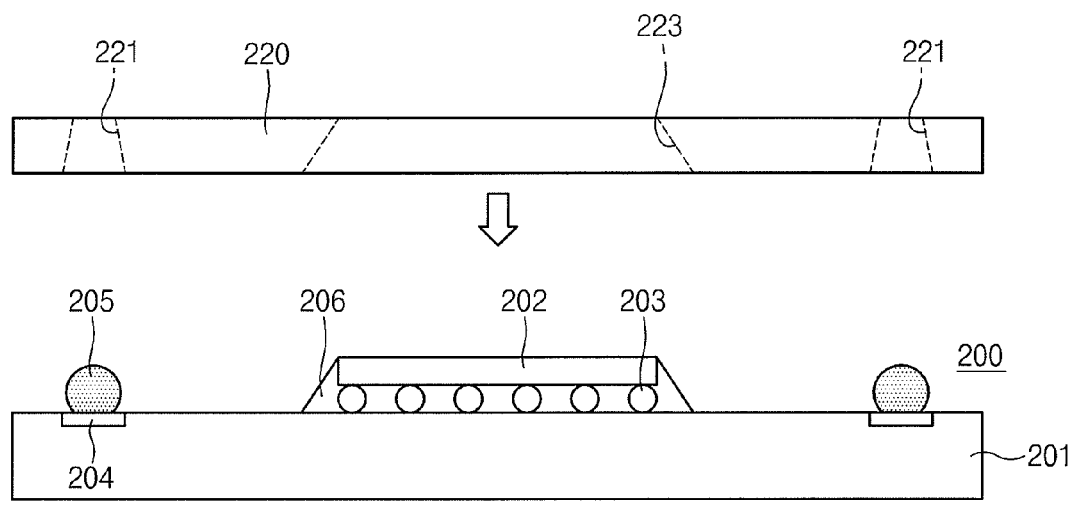
FIGS. 8 through 12 are cross-sectional views and a perspective view illustrating a method of forming a semiconductor package according to an exemplary an embodiment of the inventive concept.
Figure 9:
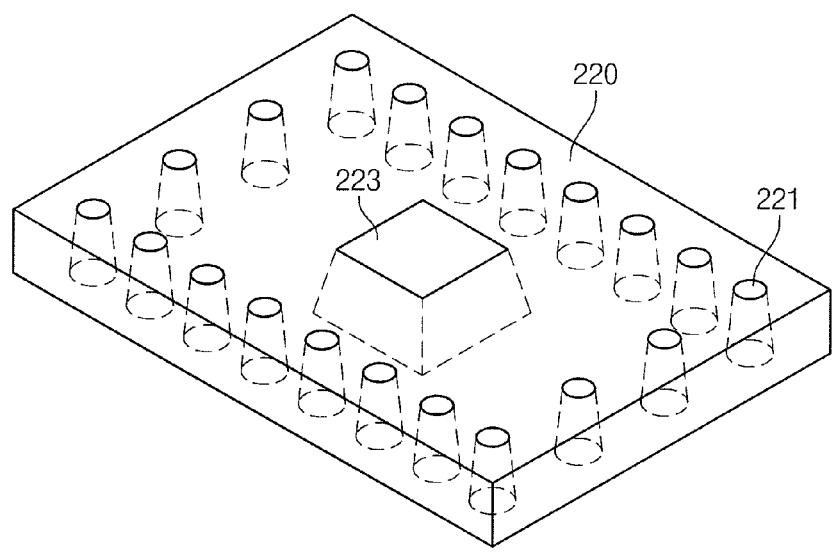

Referring to FIGS. 8 and 9, a first chip 202 may be disposed on a first substrate 201 to form a first package 200. The first substrate 201 may be electrically connected to the first chip 202 through bonding bumps or bonding wires. In the current embodiment, the first chip 202 may be electrically connected to the first substrate 201 through bonding bumps 203 in a flip chip shape. After the first chip 202 is mounted on the first substrate 201, a passivation material 206 may be formed to physically protect the first chip 202. In the current embodiment, the passivation material 206 may be disposed between the first chip 202 and the first substrate 201 and on a side wall of the first chip 202. The passivation material 206 may include, for example, an epoxy moulding compound (EMC).

The upper portion of the first substrate 201 may be provided with first pads 204 for an electrical connection. In the current embodiment, first bumps 205 are disposed on the first pads 204. The first bumps 205 may be used as members for electrically connecting to a second package to be described later.

A moulding cap 220 is disposed on the first package 200. The moulding cap 220 may include via holes 221 as passages for electrically connecting the first package 200 to the second package to be described later. The via holes 221 may be disposed at positions corresponding to those of the first bumps 205. In the current embodiment, the via holes 221 may have an upper cross section that is less than a lower cross section of the via holes 221. In the current embodiment, the moulding cap 220 may include a recess structure in the form of a structure having an open portion or opening 223 corresponding to the shape of the first chip 202 and the shape of the passivation material 206. The opening 223 is formed to reduce the height and weight of an entire package. The moulding cap 220 may be adhered to the first package 200, e.g., through an adhesive. In the current embodiment, the moulding cap 220 may be adhered to the first package 200 through an epoxy.

Figure 10:
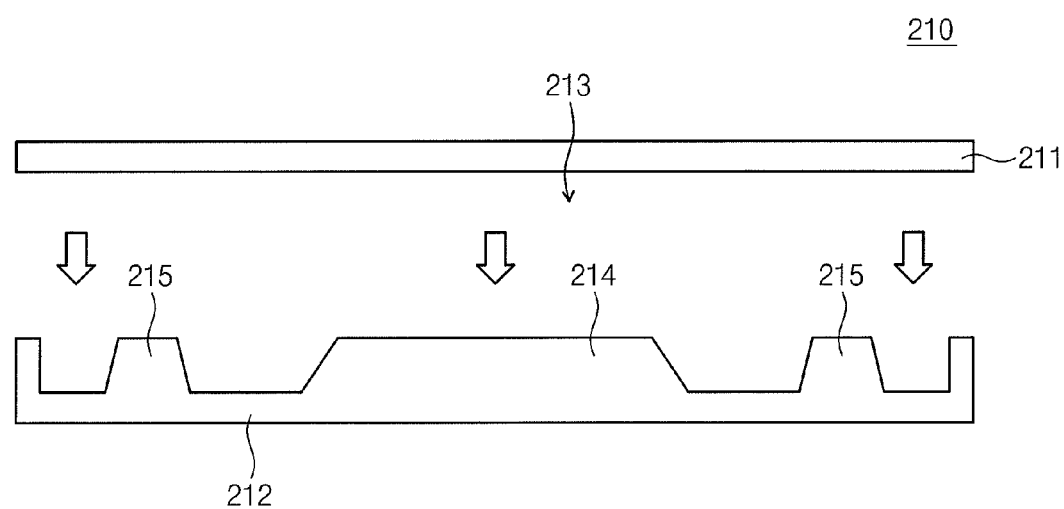

FIG. 10 is a cross-sectional view illustrating a mould 210 for forming the moulding cap 220. The moulding cap 220 and the via holes 221 may be formed using the mould 210. For example, the moulding cap 220 may be formed of EMC. In the current embodiment, the moulding cap 220 may be formed by injecting EMC into a formation region 213 between an upper mould 211 and a lower mould 212, and then, by curing the EMC. The via holes 221 and the opening 223 may be simultaneously formed. The lower mould 212 may be provided with a first projection part 214 for forming the opening 223. The lower mould 212 may be provided with second projection parts 215 for forming the via holes 221. In the current embodiment, the second projection parts 215 may have an upper cross section that is less than a lower cross section of the second projection parts 215, like the via holes 221. The moulding cap 220 may be formed in plurality in a single process using a mould, and then, be separated.

Figure 11:
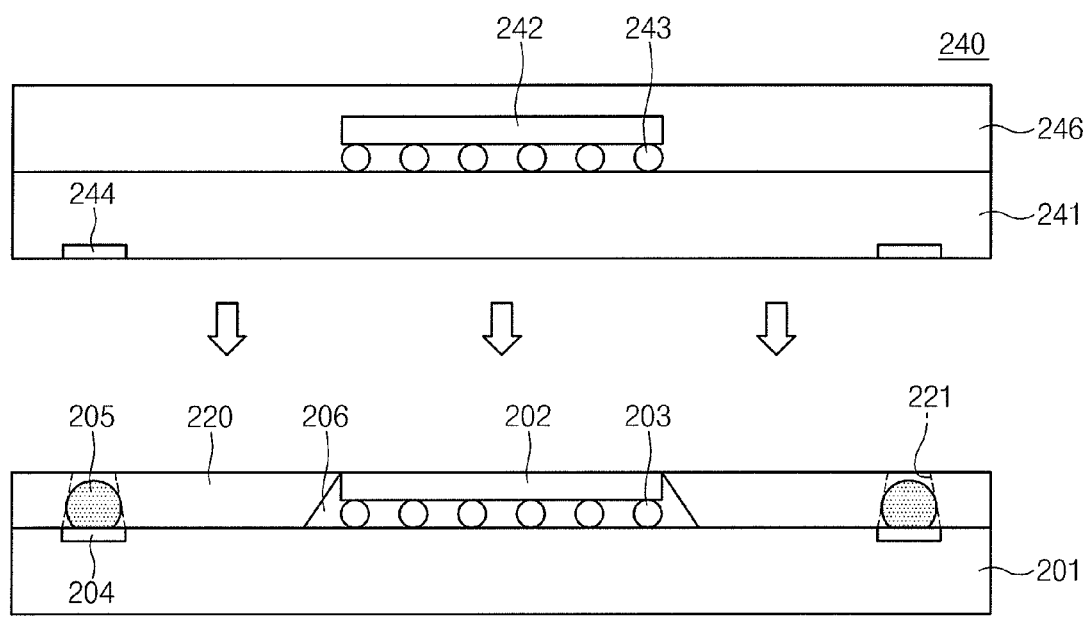

Referring to FIG. 11, a second package 240 is disposed on the first package 200 provided with the moulding cap 220. A second chip 242 is disposed on a second substrate 241 to form the second package 240. The second substrate 241 may be electrically connected to the second chip 242 through wire bonding or bumps. In the current embodiment, the second chip 242 is electrically connected to the second substrate 241 through bonding bumps 243 in a flip chip shape. After the second chip 242 is mounted on the second substrate 241, a passivation material 246 may be formed to physically protect the second chip 242. The passivation material 246 may be disposed on the second substrate 241 to mould the second chip 242. In the current embodiment, the passivation material 246 may include an epoxy moulding compound (EMC). The lower portion of the second substrate 241 may be provided with second pads 244 for an electrical connection. In the current embodiment, bumps are not disposed on the second pads 244. The second package 240 may be adhered to the moulding cap 220 through epoxy.

Figure 12:
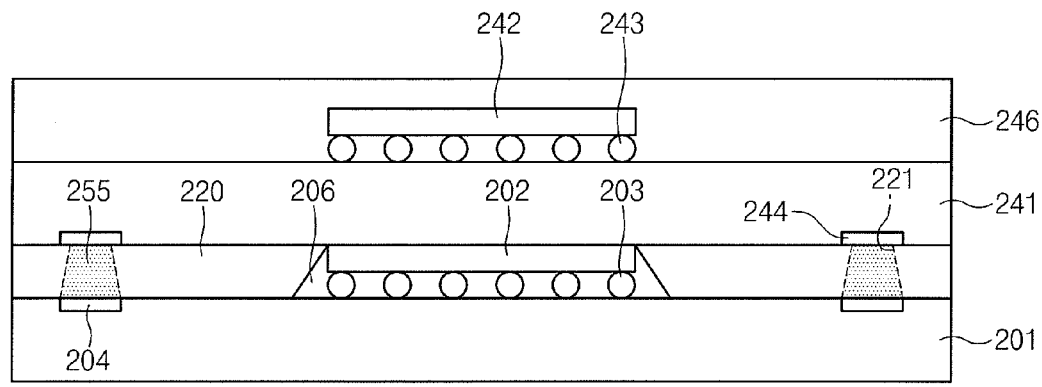

Referring to FIG. 12, the first bumps 205 reflow through a reflow process. Contacts 255 may be formed through the reflow process to electrically connect the first package 200 to the second package 240. In the current embodiment, since the upper cross sections of the via holes 221 are smaller than the lower cross sections of the via holes 221, the contacts 255 can be formed without additionally forming bumps on the second package 240.

Another Embodiment

A method of forming a semiconductor package will now be described according to another embodiment of the inventive concept. The current embodiment is similar to the previous embodiment of FIG. 1 except for a contact forming method, the shape of a via hole, and the structure of a moulding cap. Thus, descriptions of the same technical characteristics to those of the previous embodiment will be omitted for convenience.

FIGS. 13 through 17 are cross-sectional views and a perspective view illustrating the method of forming a semiconductor package according to the current embodiment.

Figure 13:
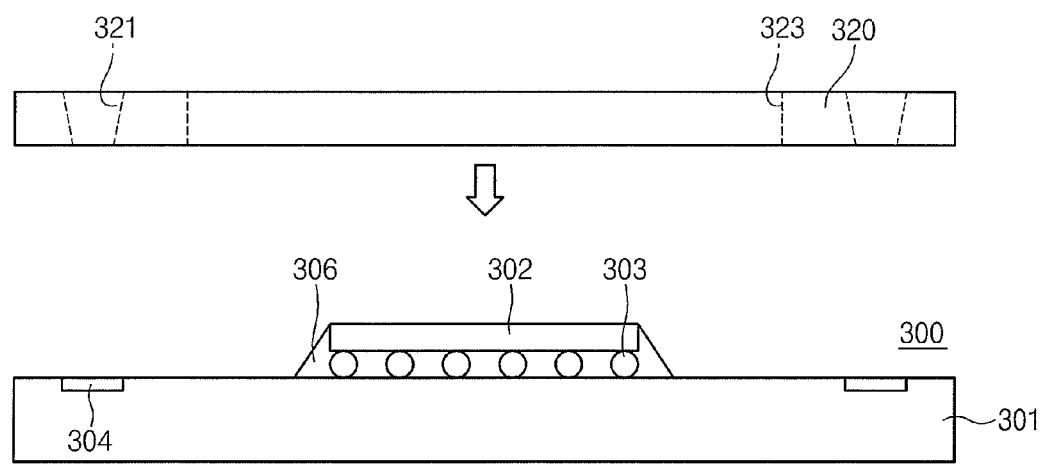
FIGS. 13 through 17 are cross-sectional views and a perspective view illustrating a method of forming a semiconductor package according to an exemplary embodiment of the inventive concept.
Figure 14:
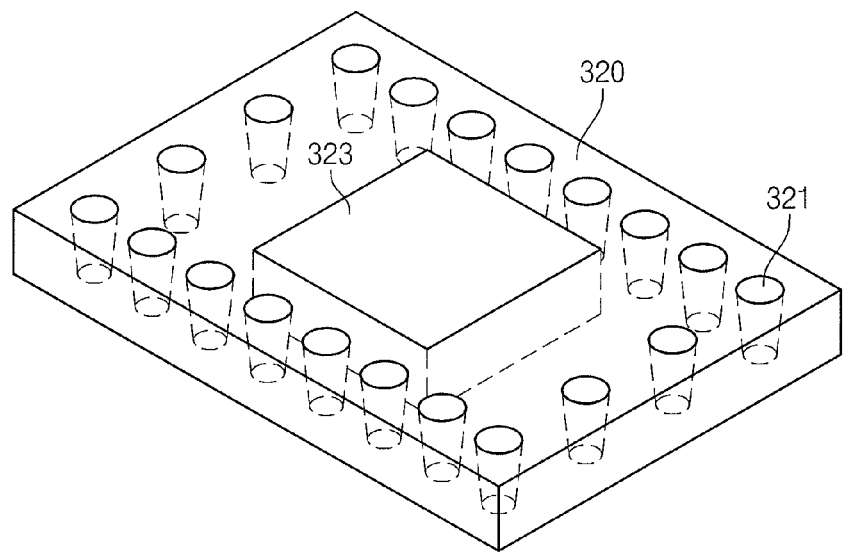

Referring to FIGS. 13 and 14, a first chip 302 may be disposed on a first substrate 301 to form a first package 300. The first substrate 301 may be electrically connected to the first chip 302 through bonding bumps or bonding wires. In the current embodiment, the first chip 302 may be electrically connected to the first substrate 301 through bonding bumps 303 in a flip chip shape. After the first chip 302 is mounted on the first substrate 301, a passivation material 306 may be formed to physically protect the first chip 302. In the current embodiment, the passivation material 306 may be disposed between the first chip 302 and the first substrate 301 and on a side wall of the first chip 302. The passivation material 306 may include, for example, an epoxy moulding compound (EMC).

The upper portion of the first substrate 301 may be provided with first pads 304 for an electrical connection. In the current embodiment, bumps are not disposed on the first pads 304.

A moulding cap 320 is disposed on the first package 300. The moulding cap 320 includes via holes 321 as passages for electrically connecting the first package 300 to a second package to be described later. The via holes 321 may be disposed at positions corresponding to those of the first pads 304. In the current embodiment, the via holes 321 may have a lower cross section that is less than the upper cross section of the via holes 321. In the current embodiment, the moulding cap 320 may include an opening 323 greater than a region corresponding to the upper portion of the first package 300. The opening 323 is formed to reduce the height and weight of an entire package. The moulding cap 320 may be adhered to the first package 300, e.g., through an adhesive. In the current embodiment, the moulding cap 320 may be adhered to the first package 300 through, for example, an epoxy.

Figure 15:
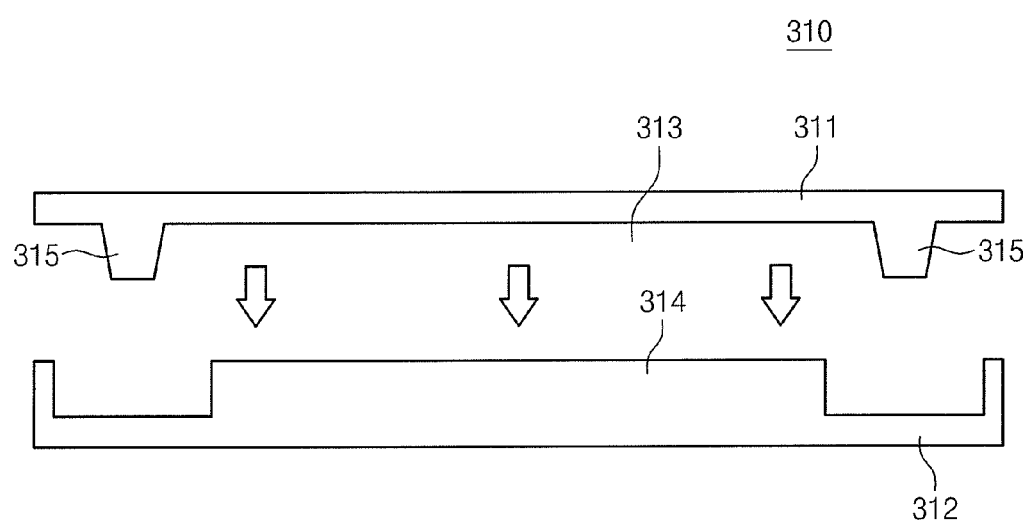

FIG. 15 is a cross-sectional view illustrating a mould 310 for forming the moulding cap 320. The moulding cap 320 and the via holes 321 may be formed using the mould 310. For example, the moulding cap 320 may be formed of EMC. In the current embodiment, the moulding cap 320 may be formed by injecting EMC into a formation region 313 between an upper mould 311 and a lower mould 312, and then, by curing the EMC. The lower mould 312 may be provided with a first projection part 314 for forming the opening 323. The upper mould 311 may be provided with second projection parts 315 for forming the via holes 321. In the current embodiment, the second projection parts 315 may have a lower cross section that is less than the upper cross section of the second projection parts 315, like the via holes 321. The moulding cap 320 may be formed in plurality in a single process using a mould, and then, be separated.

Figure 16:
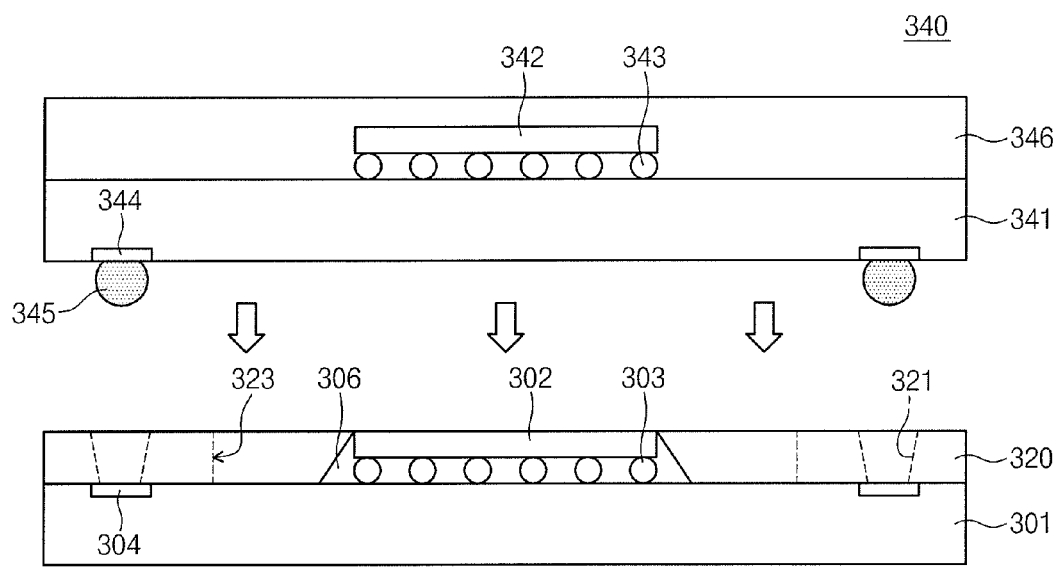

Referring to FIG. 16, a second package 340 is disposed on the first package 300 provided with the moulding cap 320. A second chip 342 is disposed on a second substrate 341 to form the second package 340. The second substrate 341 may be electrically connected to the second chip 342 through wire bonding or bumps. In the current embodiment, the second chip 342 is electrically connected to the second substrate 341 through bonding bumps 343 in a flip chip shape. After the second chip 342 is mounted on the second substrate 341, a passivation material 346 may be formed to physically protect the second chip 342. The passivation material 346 may be disposed on the second substrate 341 to mould the second chip 342. In the current embodiment, the passivation material 346 may include, for example, an epoxy moulding compound (EMC). The lower portion of the second substrate 341 may be provided with second pads 344 for an electrical connection. In the current embodiment, second bumps 345 are disposed on the second pads 344. The second bumps 345 may be used as members for electrically connecting to the first package 300. The second bumps 345 may be disposed at positions corresponding to the positions of the via holes 321. In the current embodiment, the second package 340 may be adhered to the moulding cap 320 through, for example, an epoxy.

Figure 17:
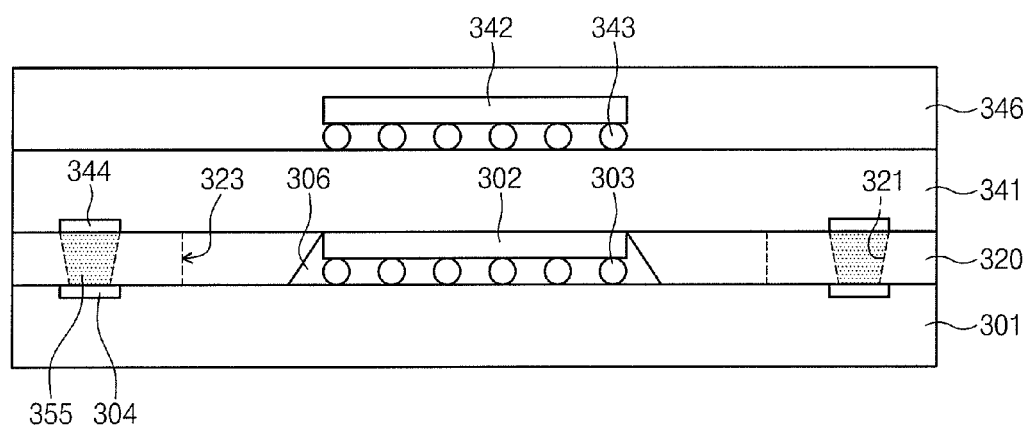

Referring to FIG. 17, the second bumps 345 reflow through a reflow process. Contacts 355 may be formed through the reflow process to electrically connect the first package 300 to the second package 340. In the current embodiment, since the lower cross sections of the via holes 321 are smaller than the upper cross sections of the via holes 321, the contacts 355 can be formed without additionally forming bumps on the first package 300.

Another Embodiment

A method of forming a semiconductor package will now be described according to another embodiment of the inventive concept. The current embodiment is similar to the previous embodiment of FIG. 1 except for a contact forming method, the shape of a via hole, and the structure of a moulding cap. Thus, descriptions of the same technical characteristics to those of the previous embodiment will be omitted for convenience.

FIGS. 18 through 22 are cross-sectional views and a perspective view illustrating the method of forming a semiconductor package according to the current embodiment.

Figure 18:
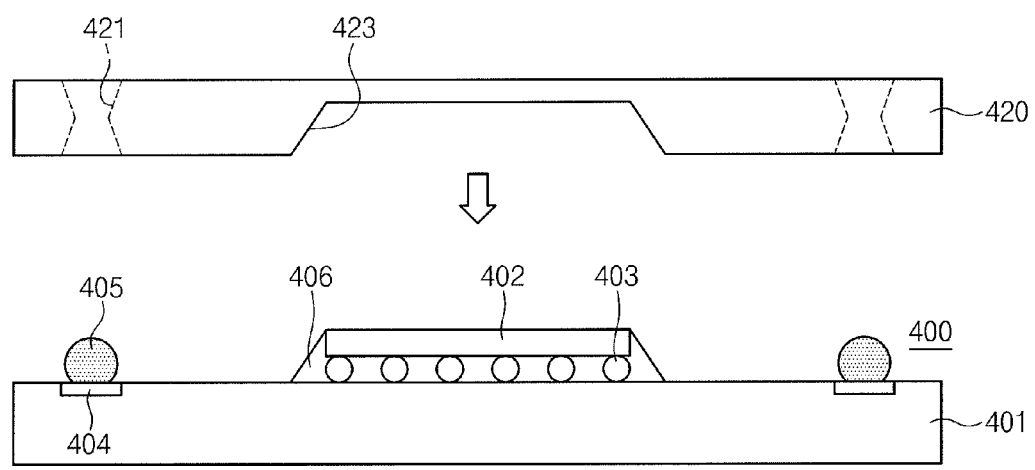
FIGS. 18 through 22 are cross-sectional views and a perspective view illustrating a method of forming a semiconductor package according to an exemplary embodiment of the inventive concept.
Figure 19:
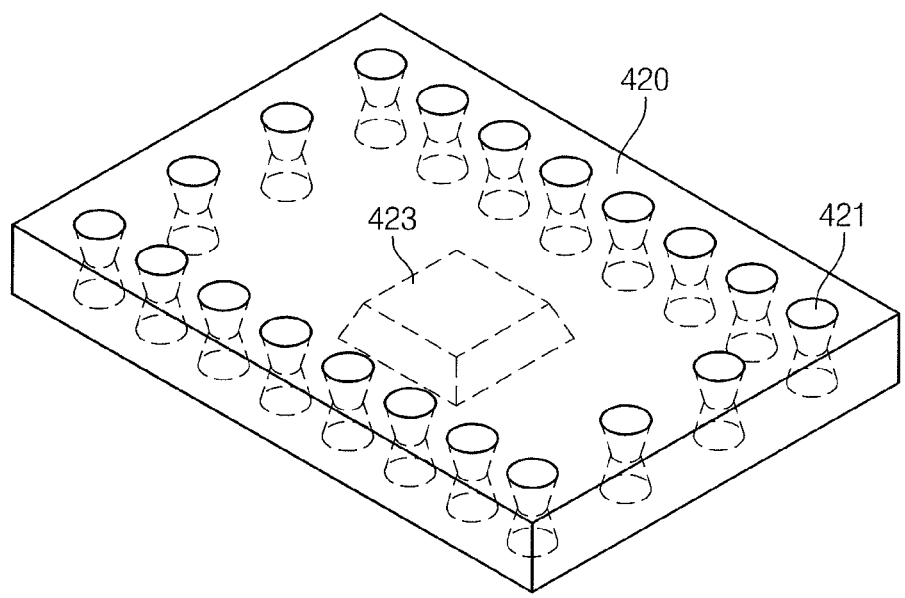

Referring to FIGS. 18 and 19, a first chip 402 may be disposed on a first substrate 401 to form a first package 400. The first substrate 401 may be electrically connected to the first chip 402 through bonding bumps or bonding wires. In the current embodiment, the first chip 402 may be electrically connected to the first substrate 401 through bonding bumps 403 in a flip chip shape. After the first chip 402 is mounted on the first substrate 401, a passivation material 406 may be formed to physically protect the first chip 402. In the current embodiment, the passivation material 406 may be disposed between the first chip 402 and the first substrate 401 and on a side wall of the first chip 402. The passivation material 406 may include, for example, an epoxy moulding compound (EMC).

The upper portion of the first substrate 401 may be provided with first pads 404 for an electrical connection. In the current embodiment, first bumps 405 are disposed on the first pads 404. The first bumps 405 may be used as members for electrically connecting to a second package to be described later.

A moulding cap 420 is disposed on the first package 400. The moulding cap 420 includes via holes 421 as passages for electrically connecting the first package 400 to the second package to be described later. The via holes 421 may be disposed at positions corresponding to those of the first bumps 405. In the current embodiment, a portion of the via hole 421, which contacts a pad, may have a greater cross section than that of a portion of the via hole 421, which does not contact the pad. That is, the via holes 421 may include great upper and lower openings and small middle openings. In the current embodiment, the lower portion of the moulding cap 420 may have a recess structure 423 corresponding to the first package 400. The moulding cap 420 may be adhered to the first package 400, e.g., through an adhesive. In the current embodiment, the moulding cap 420 may be adhered to the first package 400 through, for example, an epoxy.

Figure 20:
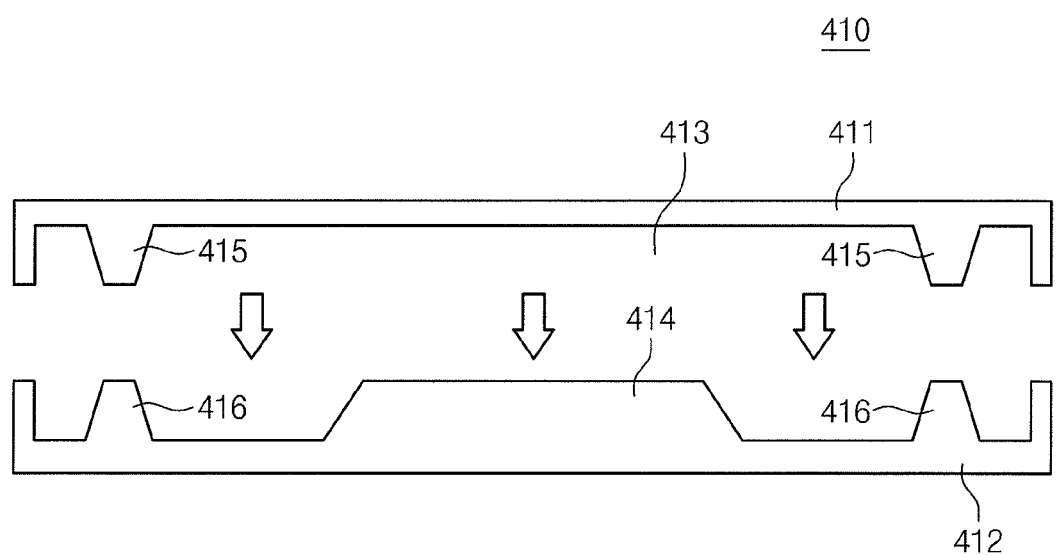

FIG. 20 is a cross-sectional view illustrating a mould 410 for forming the moulding cap 420. The moulding cap 420 and the via holes 421 may be formed using the mould 410. For example, the moulding cap 420 may be formed of EMC. In the current embodiment, the moulding cap 420 may be formed by injecting EMC into a formation region 413 between an upper mould 411 and a lower mould 412, and then, by curing the EMC. The lower mould 412 may be provided with a first projection part 414 for forming the recess structure 423. The upper mould 411 and the lower mould 412 may be respectively provided with second projection parts 415 and third projection parts 416 to form the via holes 421. In the current embodiment, the second projection parts 415 may have an upper cross section that is greater than the lower cross section of the second projection parts 415, and the third projection parts 416 may have an upper cross section that is less than the lower cross section of the third projection parts 416. The moulding cap 420 may be formed in plurality in a single process using a mould, and then, be separated.

Figure 21:
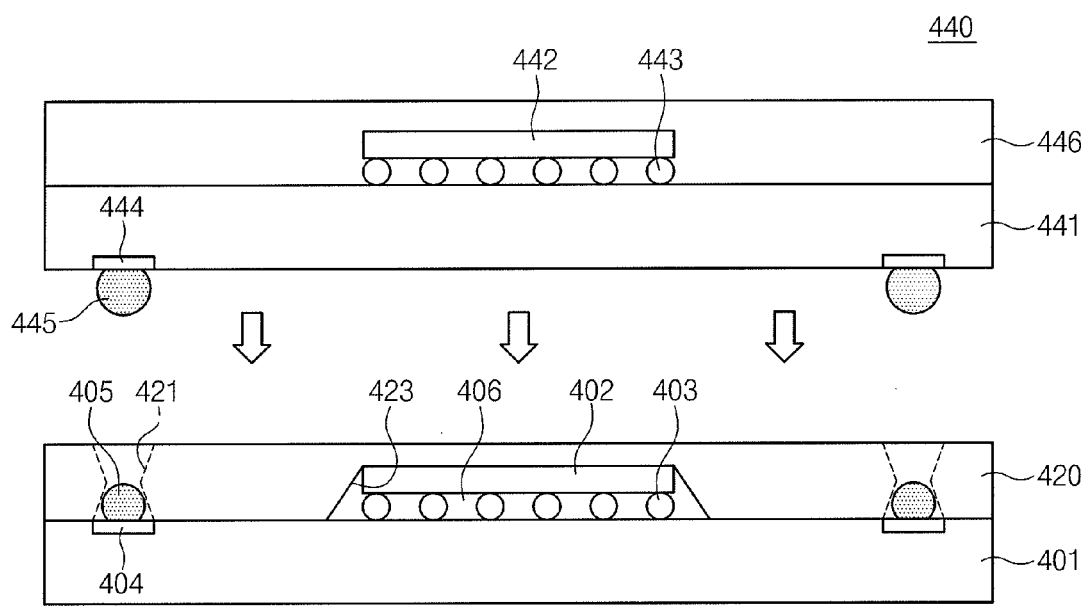

Referring to FIG. 21, a second package 440 is disposed on the first package 400 provided with the moulding cap 420. A second chip 442 is disposed on a second substrate 441 to form the second package 440. The second substrate 441 may be electrically connected to the second chip 442 through wire bonding or bumps. In the current embodiment, the second chip 442 is electrically connected to the second substrate 441 through bonding bumps 443 in a flip chip shape. After the second chip 442 is mounted on the second substrate 441, a passivation material 446 may be formed to physically protect the second chip 442. The passivation material 446 may be disposed on the second substrate 441 to mould the second chip 442. In the current embodiment, the passivation material 446 may include, for example, an epoxy moulding compound (EMC). The lower portion of the second substrate 441 may be provided with second pads 444 for an electrical connection. In the current embodiment, second bumps 445 are disposed on the second pads 444. The second bumps 445 may be used as members for electrically connecting to the first package 400. The second bumps 445 may be disposed at positions corresponding to the positions of the via holes 421. In the current embodiment, the second package 440 may be adhered to the moulding cap 420 through, for example, an epoxy.

Figure 22:
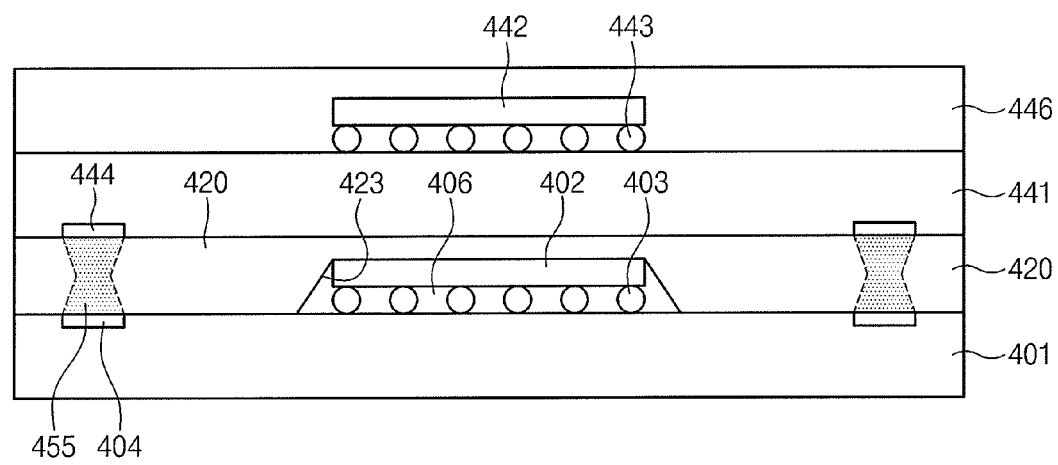

Referring to FIG. 22, the first bumps 405 and the second bumps 445 reflow through a reflow process. Contacts 455 may be formed through the reflow process to electrically connect the first package 400 to the second package 440. In the current embodiment, portions of the via hole 421, which contact the first and second pads 404 and 444 have greater cross sections than those of portions of the via hole 421, which do not contact the first and second pads 404 and 444. Thus, the contacts 455 have great portions contacting the first and second pads 404 and 444 to ensure more stable electrical connection. On the contrary, as portions of the contacts 455, which do not contact the first and second pads 404 and 444, have small cross sections, the first and second bumps 405 and 455 can be miniaturized. According to the current embodiment, as the size (diameter) of a bump decreases, a pitch between contacts can decrease. In addition, as the distance between contacts increases, electrical reliability can be improved. In addition, a moulding cap disposed between packages can be slimmed.

Figure 23:
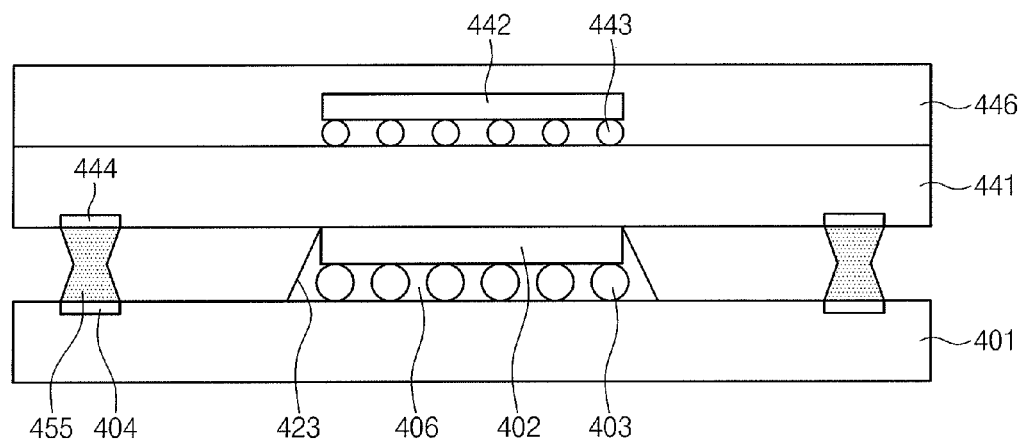
FIGS. 23 through 26 are cross-sectional views illustrating modified examples of the inventive concept.

FIGS. 23 through 26 are cross-sectional views illustrating modified examples of the inventive concept. Referring to FIG. 23, the moulding cap 420 may be removed. After the first package 400 is coupled with the second package 440, the moulding cap 420 may be removed. For example, the moulding cap 420 may be a photoresist layer. The weight of an entire package can be reduced by removing the moulding cap 420.

Figure 24:
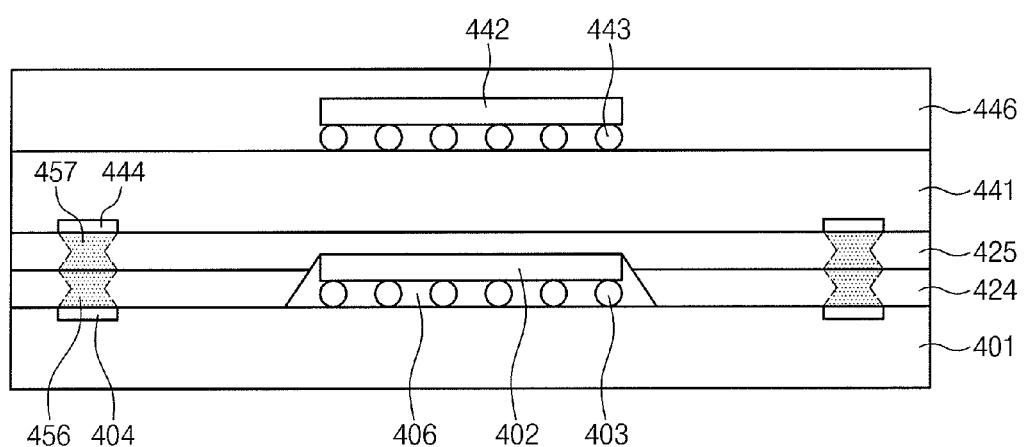

Referring to FIG. 24, a plurality of moulding caps may be provided. That is, a second moulding cap 425 may be disposed on a first moulding cap 424. The first moulding cap 424 may include first contacts 456, and the second moulding cap 425 may include second contacts 457. The first contacts 456 may be electrically connected to the second contacts 457. The first and second moulding caps 424 and 425 may be provided in three or more layers.

Figure 25:
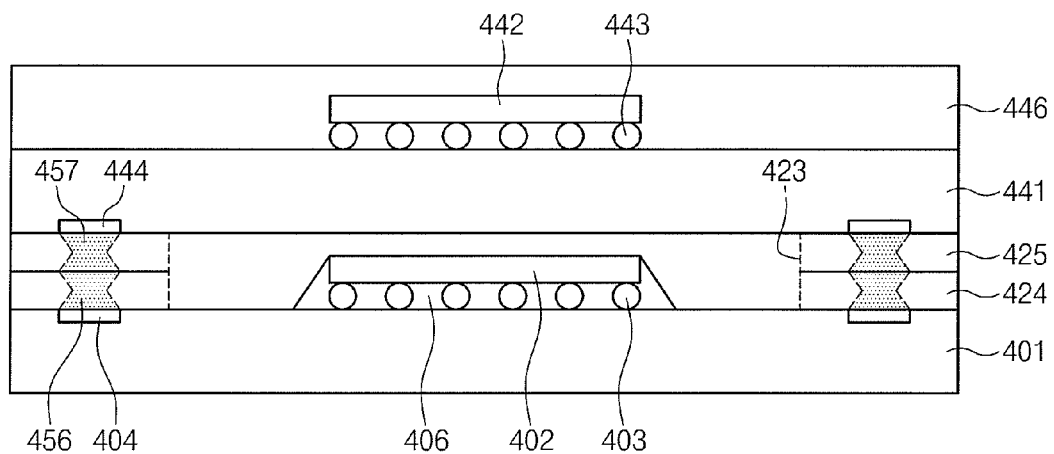

Referring to FIG. 25, openings 423 may be disposed at the first and second moulding caps 424 and 425. The openings 423 are formed to reduce the weight of an entire package.

Figure 26:
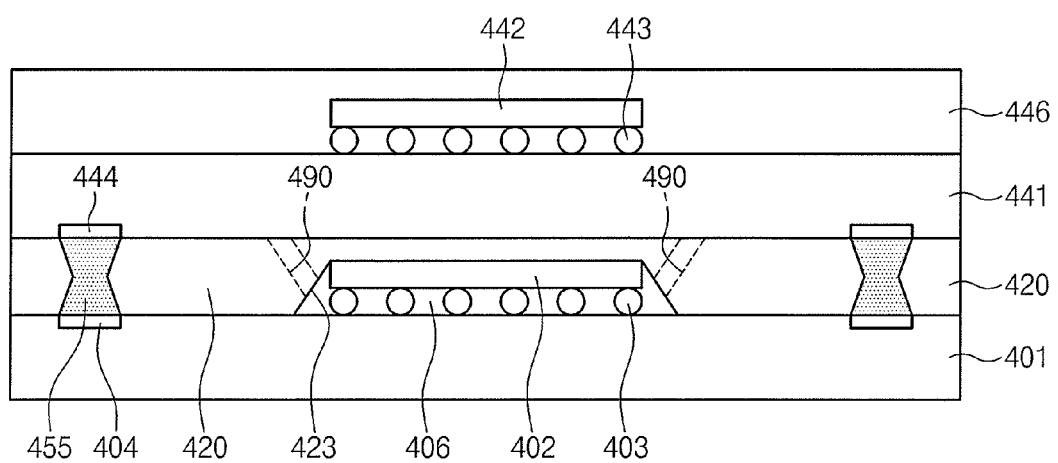

Referring to FIG. 26, via holes 490 may be disposed in the moulding cap 420. The via holes 490 are formed to reduce the weight of the moulding cap 420. The via holes 490 and the moulding cap 420 may be simultaneously formed.

Figure 27:
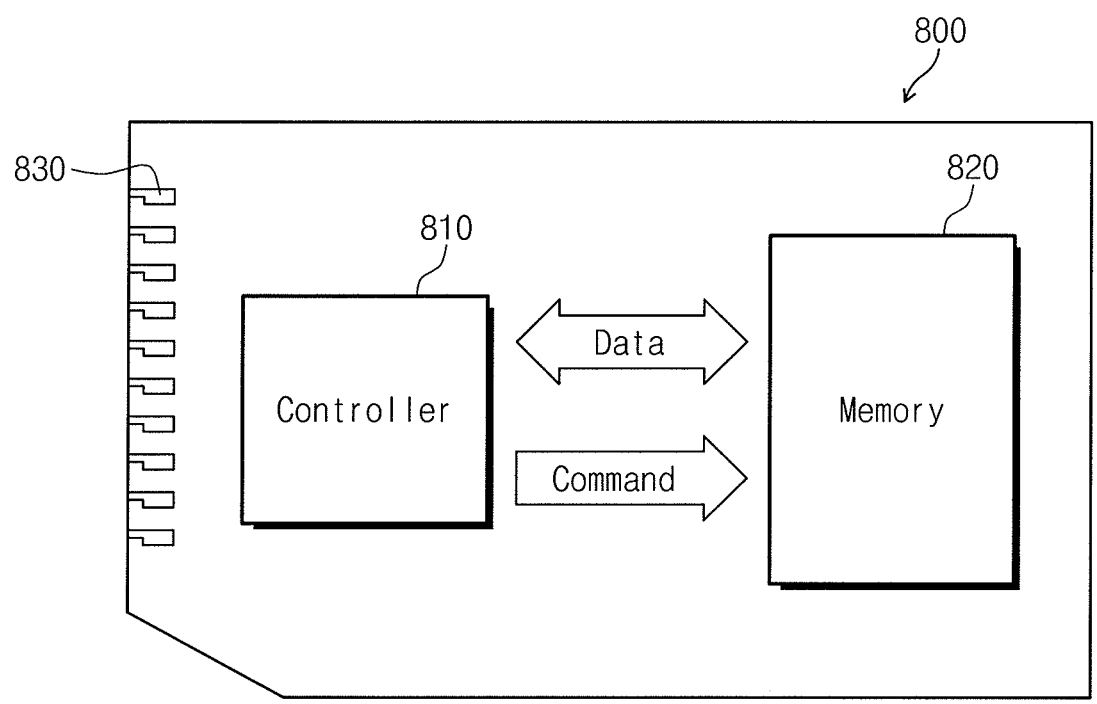
FIG. 27 is a schematic view illustrating a memory card system including semiconductor packages according to an exemplary embodiment of the inventive concept.

Referring to FIG. 27, a memory card system 800 including semiconductor packages according to embodiments of the inventive concept will now be described. The memory card system 800 may include a controller 810, a memory 820, and an interface 830. For example, the memory 820 may be used to store a command issued by the controller 810, and/or data of a user. The controller 810 and the memory 820 may be configured, for example, to receive and send the command and/or the data. The interface 830 may be adapted, for example, to connect to the outside, for data input and output. The semiconductor packages according to the embodiments of the inventive concept are multi chip packages (MCPs) having improved thermal reliability, which may function as the controller 810 and the memory 820. According to an embodiment of the inventive concept, a connection terminal of the semiconductor package may be formed in-situ without a photo process.

The memory card system 800 may be, for example, a multimedia card (MMC), a secure digital card (SD), or a portable data storage device.

Figure 28:
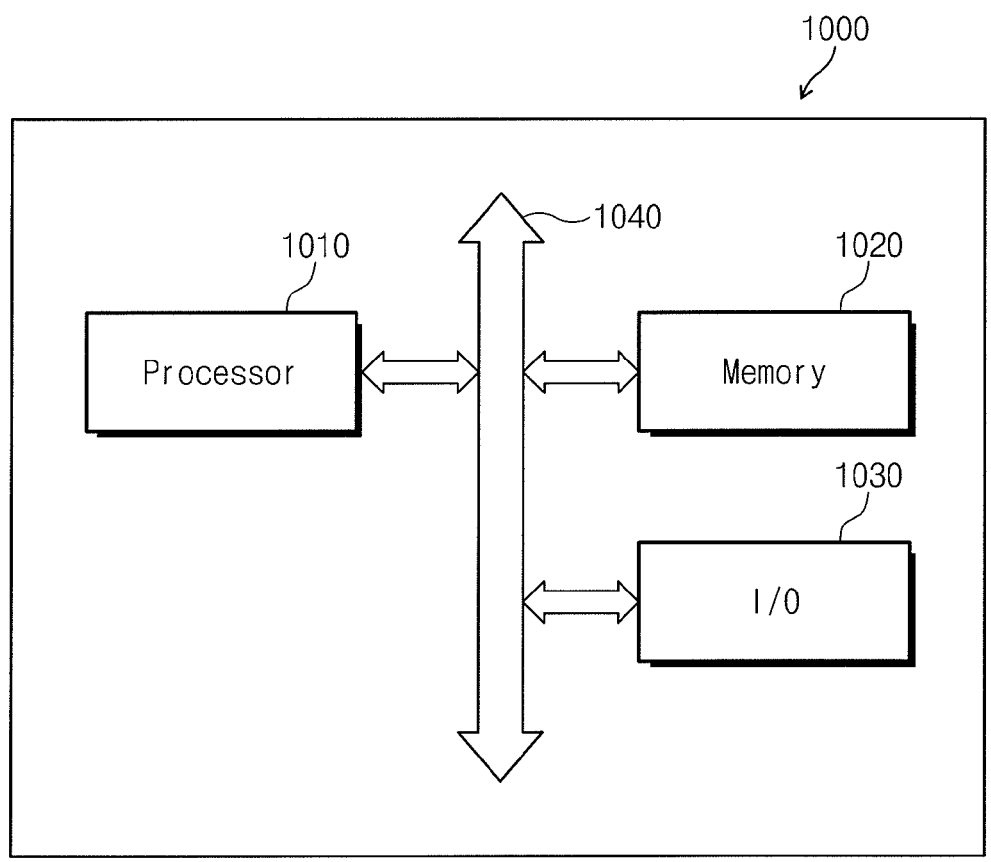
FIG. 28 is a block diagram illustrating an electronic device including semiconductor packages according to an exemplary embodiment of the inventive concept.

Referring to FIG. 28, an electronic device 1000 including semiconductor packages according to embodiments of the inventive concept will now be described. The electronic device 1000 may include, for example, a processor 1010, a memory 1020, and an input/output device (I/O) 1030. The processor 1010, the memory 1020, and the input/output device 1030 may be connected to each other through, for example, a bus 1040. The memory 1020 may receive a control signal from the processor 1010. The memory 1020 may be used to store data that is accessed through the bus 1040. It will be apparent to those skilled in the art that realizations and variations can be made in the inventive concept by providing an additional circuit and an additional control signal.

The electronic device 1000 can be applied to, for example, computer systems, wireless communication devices including PDAs, laptop computers, portable computers, web tablets, wireless telephones, mobile phones, digital music players, MP3 players, navigation systems, solid state disks (SSDs), and household appliances, and any devices used for data transmission in a wireless environment.

According to the embodiments of the inventive concept, the moulding cap is disposed between the packages, and the moulding cap is formed using a mould to address a limitation occurring when a via hole is formed using a member such as, for example, a laser. Furthermore, the shape of the via hole can be modified to form a more reliable package structure.

Having described the exemplary embodiments of the inventive concept, it is further noted that various modifications can be made herein without departing from the spirit and scope of the invention as defined by the metes and bounds of the appended claims.

The above-disclosed subject matter is to be considered illustrative, and not restrictive, and the appended claims are intended to cover all such modifications, enhancements, and other embodiments, which fall within the true spirit and scope of the inventive concept. Thus, to the maximum extent allowed by law, the scope of the inventive concept is to be determined by the broadest permissible interpretation of the following claims and their equivalents, and shall not be restricted or limited by the foregoing detailed description.

What is claimed is:

1. A method of forming a semiconductor package, the method comprising:
    forming a first package including a first chip on a first substrate;
    forming a second package including a second chip on a second substrate;
    forming a moulding cap provided with a via hole and a recess structure configured to receive the first chip, wherein the via hole and the recess structure are simultaneously formed and wherein the moulding cap is formed separately from the first package and the second package;
    providing the second package on the first package with the moulding cap being therebetween such that the recess structure receives the first chip; and
    providing a contact in the via hole connecting the first package and the second package, wherein the contact is in direct physical contact with the moulding cap.

2. The method of claim 1, wherein the moulding cap is formed using a mould that has projection parts providing the via hole and the recess structure.

3. The method of claim 2, further comprising:
    forming a first pad at the first package to correspond to the via hole; and
    forming a second pad at the second package to correspond to the via hole.

4. The method of claim 3, wherein the forming of the contact comprises:
    providing a solder ball on at least one of the first pad and the second pad; and
    providing the solder ball into the via hole.

5. The method of claim 4, wherein the providing of the solder ball into the via hole comprises performing a reflow process on the solder ball.

6. The method of claim 3, wherein an end of the contact comprises a greater cross section than that of another end of the contact.

7. The method of claim 3, wherein portions of the contact contacting the pads comprise greater cross sections than that of another portion of the contact that does not contact the pads.

8. The method of claim 7, wherein a middle portion of the contact comprises a cross section that is less than those of upper and lower portions of the contact.

9. The method of claim 1, wherein the moulding cap is formed of an epoxy moulding compound (EMC).

10. A method of forming a semiconductor package, the method comprising:
    forming a first package including a first chip on a first substrate by mounting the first chip on the first substrate, electrically connecting the first substrate to the first chip through bonding bumps or bonding wires and forming a passivation material between the first substrate and the first chip and on a sidewall of the first chip;
    forming a second package including a second chip on a second substrate by mounting the second chip on the second substrate, electrically connecting the second substrate to the second chip through bonding bumps or bonding wires and forming a passivation material on the second substrate to mould the second chip;
    forming a moulding cap provided with via holes and a recess structure configured to receive the first chip, wherein the molding cap is formed using a mould comprising an upper mould and a lower mould and by injecting an epoxy moulding compound (EMC) into a formation region between the upper mould and the lower mould and then curing the EMC, wherein the lower mould is provided with a first projection for forming the recess structure and the upper mold is provided with a second projection for forming the via holes, and wherein the moulding cap is formed separately from the first package and the second package;
    adhering the moulding cap to an upper surface of the first package by an adhesive such that the recess structure receives the first chip therein;
    providing the second package on a top surface of the moulding cap adhered to the first package such that the moulding cap is disposed between the first package and the second package;
    providing a solder ball into at least one of the via holes of the moulding cap; and
    forming a contact in the at least one of the via holes of the moulding cap by performing a reflow process on the solder ball, thereby connecting the first package and the second package, wherein the contact is in direct physical contact with the moulding cap.

11. The method of claim 10, wherein the lower mould used to form the moulding cap further comprises a third projection part for forming the via holes, such that the via holes formed in the moulding cap are defined by the second projection part of the upper mould and the third projection part of the lower mould and wherein the via holes have a constant cross-section and wherein the recess structure and the via holes are formed simultaneously.

12. The method of claim 11, wherein the forming of the first package further comprises forming first pads on an upper portion of the first substrate and forming first bumps on the first pads at positions corresponding to positions of the via holes and wherein the forming of the second package further comprises forming second pads on a lower portion of the second substrate and forming second bumps on the second pads at positions corresponding to the positions of the via holes.

13. The method of claim 10, wherein the second projection part of the upper mould has a lower cross section that is less than an upper cross section of the second projection part, such that each of the via holes formed in the moulding cap have a lower cross section which is smaller than an upper cross section of the via holes.

14. The method of claim 13, wherein the forming of the first package comprises forming first pads on an upper portion of the first substrate at positions corresponding to positions of the via holes, forming second pads on a lower portion of the second substrate for and forming bumps on the second pads at positions corresponding to positions of the via holes.

15. The method of claim 10, wherein the lower mould used to form the molding cap further comprises a third projection part, such that the via holes formed in the molding cap are defined by the second projection part of the upper mould and the third projection part of the lower mould, wherein the second projection part has an upper cross section that is greater than a lower cross section of the second projection part and wherein the third projection part has an upper cross section that is less than a lower cross section of the third projection part such that portions of the via holes formed in the moulding cap which contact the first pads and the second pads have greater cross sections than portions of the via holes formed in the moulding cap which do not contact the first pads and the second pads.

16. The method of claim 15, wherein the forming of the first package further comprises forming first pads on an upper portion of the first substrate and forming first bumps on the first pads at positions corresponding to positions of the via holes and wherein the forming of the second package further comprises forming second pads on a lower portion of the second substrate and forming second bumps on the second pads at positions corresponding to the positions of the via holes.

17. The method of claim 5, wherein substantially the entire solder ball is disposed in the via hole of the moulding cap.

18. The method of claim 10, wherein substantially the entire solder ball is disposed in the at least one of the via holes of the moulding cap.

* * * * *